United States Patent [19]
Cairns

[11] 3,971,691
[45] July 27, 1976

[54] APPARATUS FOR FILM APPLICATION
[75] Inventor: Michael John Cairns, Newark, Del.
[73] Assignee: Hercules Incorporated, Wilmington, Del.
[22] Filed: Mar. 27, 1975
[21] Appl. No.: 562,726

[52] U.S. Cl.................. 156/497; 156/500; 156/522; 156/577; 156/582; 355/85
[51] Int. Cl.² .................. B32B 31/00
[58] Field of Search .......... 156/497, 500, 515, 522, 156/526, 524, 537, 555, 574, 577, 556, 582; 355/85, 97, 99, 100

[56] References Cited
UNITED STATES PATENTS

| | | | |
|---|---|---|---|
| 2,818,908 | 1/1958 | Byrnes et al. | 156/522 |
| 2,961,031 | 11/1960 | Fener | 156/515 |
| 3,502,536 | 3/1970 | Youngman et al. | 156/519 |
| 3,671,362 | 6/1972 | Pierce et al. | 156/574 |
| 3,751,164 | 8/1973 | Miller et al. | 355/100 |
| 3,832,262 | 8/1974 | Rubaud | 156/577 |
| 3,848,998 | 11/1974 | Yonekura et al. | 355/85 |

Primary Examiner—Douglas J. Drummond
Assistant Examiner—M. G. Wityshyn
Attorney, Agent, or Firm—James W. Peterson

[57] ABSTRACT

The invention is apparatus for laying film in wrinkle-free fashion on a flat surface. A protective film is automatically laid down on a flat rigid vacuum support plate capable of having an image bearing transparency thereon when the instant invention traverses the rigid support plate in one pass in one direction. A photosensitive material and a backing material may then be subsequently supplied to the rigid support plate upon a second pass in the reverse direction to provide a photopolymer plate which may be exposed through a transparency covered by said first film. The resulting photopolymer plate having hardened relief image areas may then be further treated to provide a printing plate.

2 Claims, 5 Drawing Figures 3,971,691

APPARATUS FOR FILM APPLICATION

BACKGROUND OF THE INVENTION

Various apparatuses and processes have already been made available for producing a photopolymer plate having relief image areas using a photosensitive material, for example, U.S. Pat. No. 3,848,998, which describes apparatus which automatically produces a photopolymer plate by moving back and forth with respect to the image bearing transparency. The instant invention provides an improvement over said apparatus by providing a movable carriage which transverses an image bearing transparency in one direction and automatically in one pass lays down a protective cover film over said transparency and automatically severs said protective film after traversing said transparency and upon reversal of said carriage doctors photopolymer and rolls a backing sheet thereon for purposes of making a plate. The novel apparatus of the instant invention provides unique means for applying a protective cover film from a continuous roll over any flat surface, whether for the purpose of protecting a transparency or for any other purpose in which it is highly desirable to have wrinkle-free automatic film application in one pass.

SUMMARY OF THE INVENTION

The invention is apparatus for laying film in wrinkle-free fashion on a flat vacuum plate wherein said apparatus utilizes a controlled cover film supply roll mounted on a movable carriage transversing said flat plate and further including a pressure roll which contacts said film and presses said film against said plate, said pressure roll being rotatably and eccentrically mounted, and further including a combination of vacuum and air bars and hot wire cutting means to automatically sever said film on completion of its application and to automatically contain said loose end of said film instantaneously upon severing said film.

DESCRIPTION OF THE PREFERRED EMBODIMENT

Figure 1:
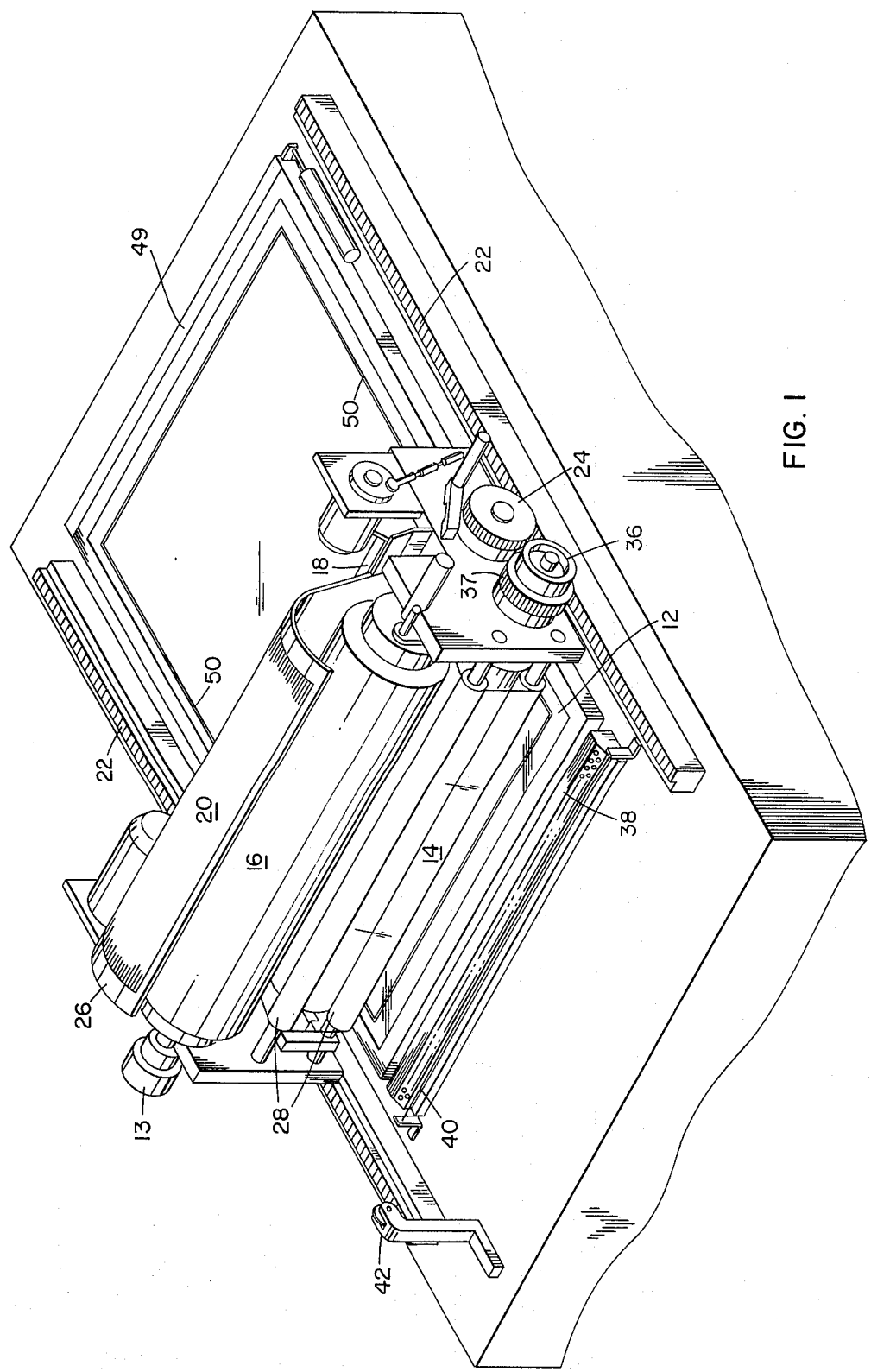
FIG. 1 is a perspective view of the plate making apparatus of the instant invention.
Figure 2:
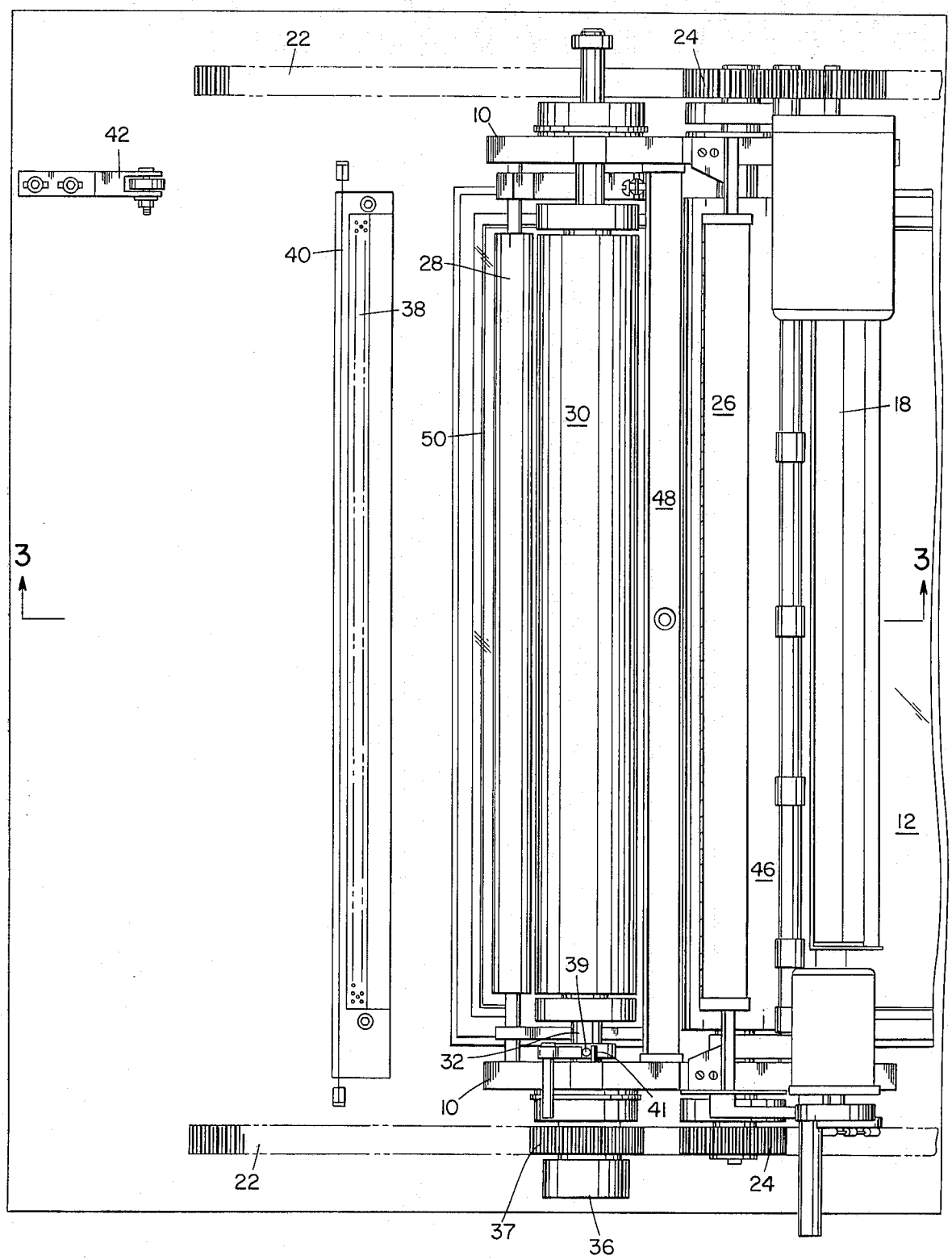
FIG. 2 is a partial plan view of the plate making carriage shown in FIG. 1.
Figure 3:
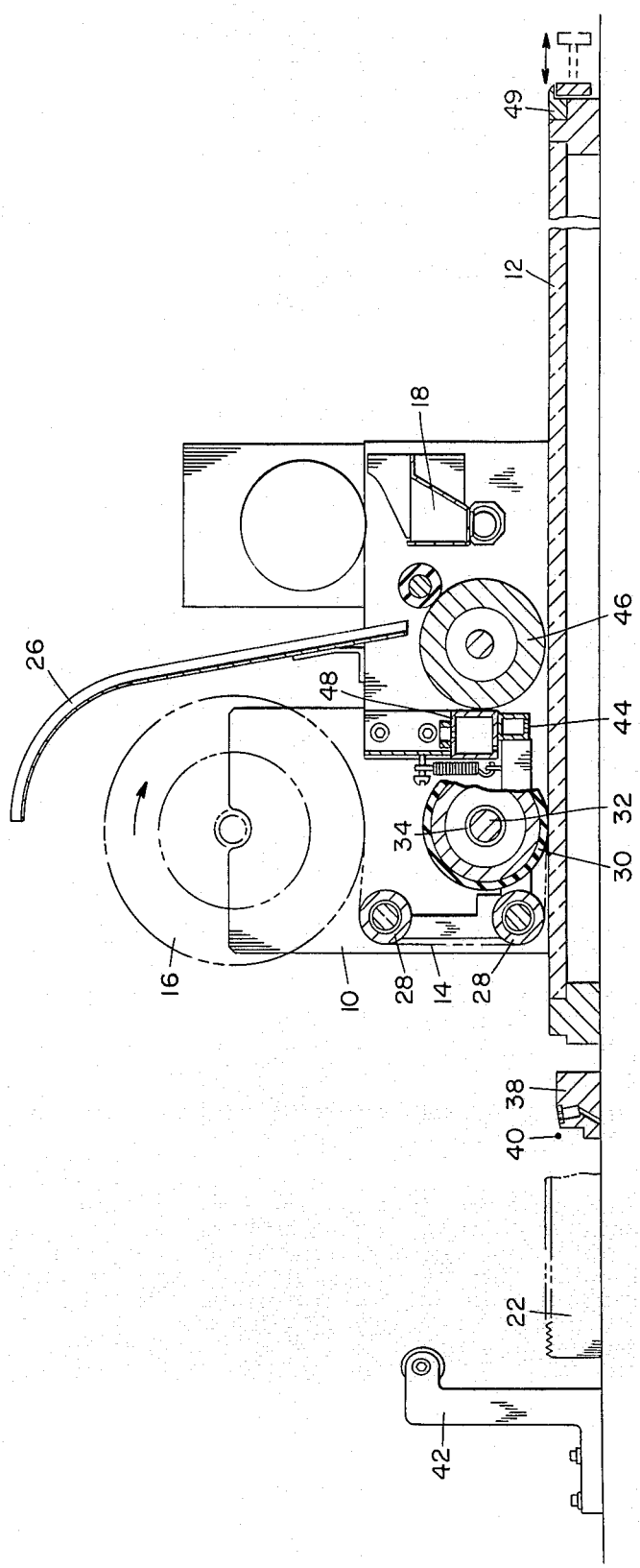
FIG. 3 is a section view taken along section lines 3—3 in FIG. 2 illustrating the film applicator of the instant invention when the carriage assembly is traversing a flat plate in a first direction.
Figure 4:
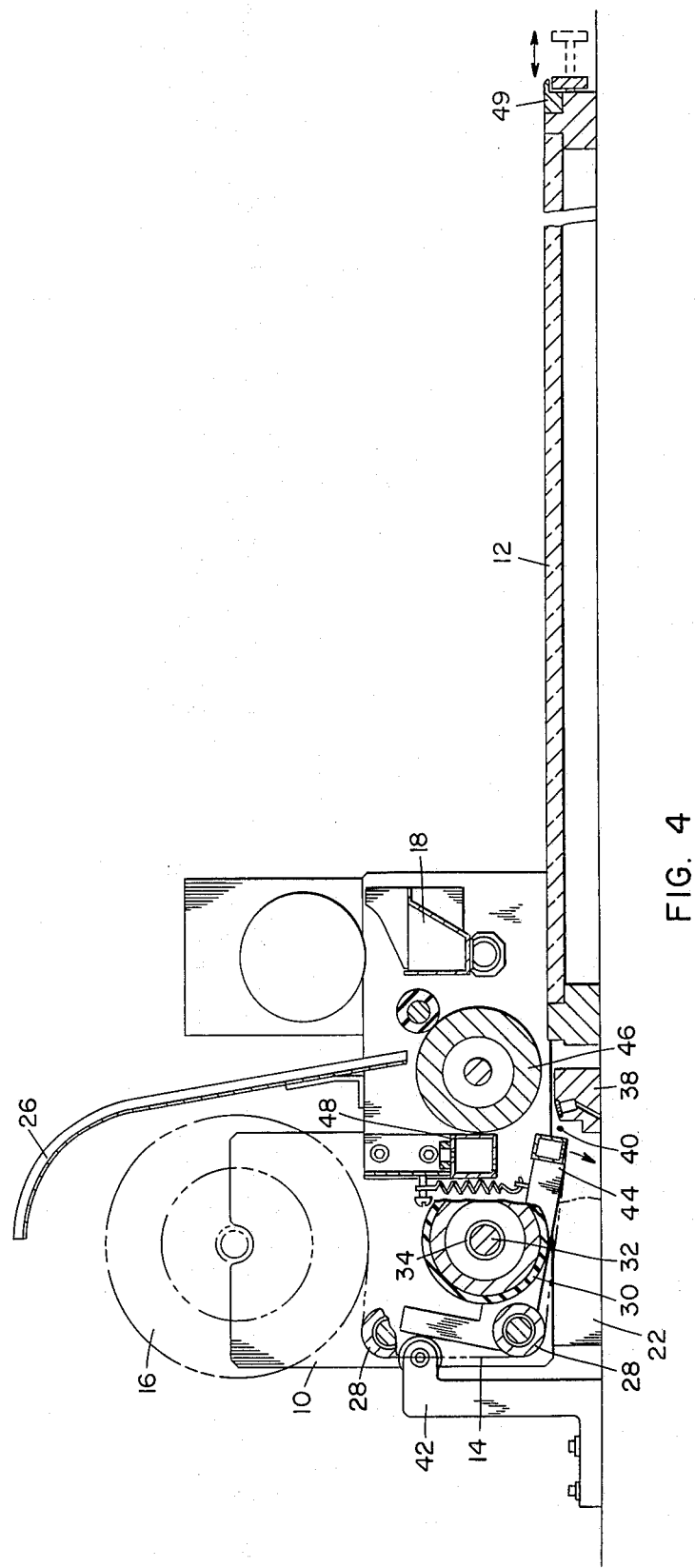
FIG. 4 is a full section view of the plate making apparatus shown in FIG. 3 when said carriage has traversed said flat plate to its end, stopped, reversing position.
Figure 5:
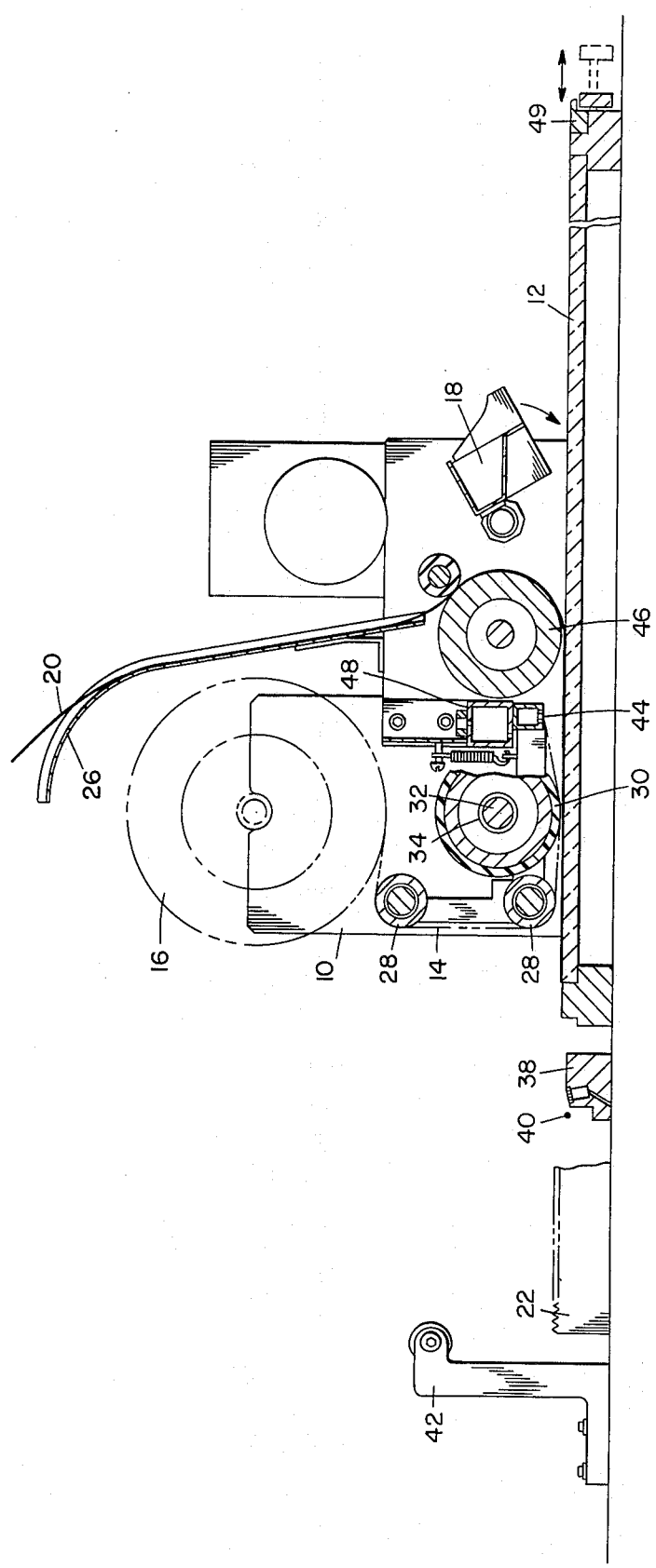
FIG. 5 is a full section view of said plate making apparatus when said carriage is traversing said flat plate in the second, opposite direction.

With continued reference to the drawing, FIG. 1 illustrates in perspective view the plate making apparatus of the instant invention which includes the novel film dispensing means. Carriage 10 reciprocally traverses flat plate 12 to apply a protective film 14 from cover film supply roll 16 when traversing to the left, as shown in FIG. 1, and distributes photopolymer from rotating bucket 18 on the surface of said film while simultaneously rolling a backing sheet 20 onto the surface of said photopolymer when said carriage reverses and goes to the right, as shown in FIG. 1. The carriage 10 is reciprocally mounted with respect to flat plate 12 by racks 22 and pinions 24 and 37. FIG. 2 illustrates the positioning of said racks and pinions as well as the positioning of cover film supply roll 16. For purposes of illustration in FIG. 2, the backing sheet guide 26 illustrated in FIG. 1 for backing sheet 20, has been partially shown and film supply roll 16 has been omitted. FIGS. 3, 4 and 5 illustrate various operative positions and functions of the film applicator as well as the polymer and backing sheet applicator combination of the instant invention. FIG. 3 shows film 14 from cover film supply roll 16 threaded over guide means 28, shown as rolls, said film being fed under pressure roller 30 and pressed into contact with flat plate 12. Film 14 is tensioned by rotational resistance to film supply roll 16 caused by friction clutch means 13. Friction clutch means 13 comprises the combination of a slip clutch and torsion spring to provide static and dynamic film tension. It is understood that an image bearing photo transparency may be positioned upon flat plate 12 and may thereby be covered with said film for purposes of protection and further plate making, but, it is also understood that the novel film applicator being described may be utilized to apply film for whatever reason to a flat surface.

Pressure roller 30 is rotatably connected to carriage 10 by eccentric means. The eccentric means comprises bearing 34 on axle 32, said axle 32 eccentrically mounted to carriage 10. As seen in FIG. 1, two-way slip clutch 36 is mounted between axle 32 and pinion 37, such that rotation of the pinion 37 through approximately 180° will move the axle 32 vertically from one extreme eccentric position to its other extreme position. As seen in FIG. 2, a radially extending pin 39 extends from axle 32 and contacts stop 41 at one extreme position. An identical stop (not shown) is mounted below the axle 32 approximately 180° of pin rotation from stop 41. The stops and pin 39 stop rotation of the axle 32 in one extreme eccentric position or another. Clutch 36 slips after axle 32 has rotated to its stopped positions. The pressure roller 30 is therefore rotated into contact with the flat plate from a non-contact position above said flat plate when the carriage 10 initially moves to the left and out of contact as the carriage moves to the right as viewed in FIG. 1. The spacing produced by said eccentric means is sufficient to prevent contact of said pressure roller 30 with the back of said backing sheet 20 having photopolymer squeezed thereunder when said carriage travels to the right, as shown in FIG. 5. That is, the function of the eccentrically mounted pressure roller 30 is to uniformly apply pressure to the film being applied when the carriage traverses in one direction and upon limited return linear movement to elevate said pressure roller to prevent contact with said film previously applied when said carriage returns in said opposite direction.

As the carriage 10 continues to move to the left, as shown in FIG. 3, it will traverse over the stationary vacuum bar 38 and hot wire 40. Hot wire 40 is energized at the start of the carriage 10 and vacuum bar 38 and vertically movable rotatable vacuum bar means 44 are activated when the carriage contacts vacuum bar actuator 42, as shown in FIG. 4. Vacuum bar activator 42 causes vertically movable rotatable vacuum bar means 44 to rotate clockwise, as indicated by the directional arrows, said rotational vacuum bar 44 forcing film 14 in contact with hot wire 40 severing film 14. The trailing edge of film 14 being supplied by cover film supply roll 16 is picked up and retained by rotatable vacuum bar 44. The severed film on the flat plate is retained by stationary vacuum bar 38. As the carriage 10 reverses its direction and moves to the right, as shown in FIG. 5, the rotational vacuum bar 44 rotates in a counterclockwise direction to pick up the trailing edge of film above and free of contact with the plate 12. Pressure roll 30 has, as previously described, likewise moved vertically upward and out of contact with plate 12. While the carriage 10 moves to the right, as shown in FIG. 5, rotatable bucket 18 rotates clockwise to dump photopolymer contained therein on film 14. Backing sheet 20 simultaneously is rolled onto the surface of said photopolymer by roller 46. After carriage 10 completes its pass to the right, as shown in FIG. 5, and comes to rest, the composite of the photopolymer and backing sheet is exposed through the transparency protected by the film 14, said photopolymer thereby being selectively hardened. The exposed composite is then removed and the unexposed portions of the photopolymer are washed out, leaving a photopolymer printing plate. As the cycle, described previously, is started and pressure roller 30 contacts film 14 with plate 12, air pressure bar 48 is activated and rotating vacuum bar 44 and stationary vacuum bar 38 are deactivated, thereby blowing the trailing edge of the film down toward and in contact with plate 12. Plate 12 is provided with vacuum channels 50 to hold said film 14, when blown down by air bar 48 and further pressed in contact with plate 12 by pressure roller 30. Safety clamp means 49 shown in FIG. 1 may be momentarily activated as the film 14 contacts plate 12 to positively secure the leading edge of film 14. The momentary clamping insures the release of film 14 from vacuum bar 44 in case of resin contamination of carriage parts. The safety clamp means 49 is not necessary to lay film and is only useful in the accidental presence of extremely tacky photosensitive material.

It is understood that the invention is not limited to the precise construction shown, but that changes are contemplated as readily fall within the spirit of the invention, as shall be determined by the scope of the appended claims.

What I claim and desire to protect by Letters Patent is:

1. Film application apparatus for laying film in wrinkle-free fashion on a flat plate comprising:
   a flat plate having vacuum channels in the surface thereof, said flat plate having a front end and a rear end;
   a carriage reciprocally mounted on said flat plate to traverse said flat plate;
   cover film supply roll rotatably connected to said carriage by friction clutch means to provide resistance to rotation of said film to statically and dynamically tension said film;
   pressure roller to press said film in contact with said plate;
   eccentric means rotatably connecting said pressure roller to said carriage, initial linear motion of said carriage in one direction from said front end to said rear end moving said pressure roller into contact with said film and initial linear motion in the opposite direction moving said pressure roller to an elevated spaced apart position above said flat plate;
   hot wire cutting means positioned adjacent said rear end of said flat plate to sever said film rolled onto the surface of said flat plate when said carriage reaches said rear end of said flat plate;
   vertically movable vacuum bar means movably connected to said carriage to force film into contact with said cutting means and to hold the trailing edge of the cover film supply roll when severed;
   a stationary vacuum bar positioned adjacent said hot wire cutting means at said rear end of said flat plate to retain the severed portion of the film on said flat plate after said vertically movable vacuum bar forces the film into contact with said hot wire cutting means;
   air bar means connected to said carriage and interconnected with said vertically movable vacuum bar to release said trailing edge of the cover film supply roll and blow said film toward said flat plate upon initial movement of said carriage in said one direction; and,
   means for feeding a liquid photosensitive material onto said film to form a layer of photosensitive material and means for laminating a backing material onto said layer of photosensitive material, said means for feeding liquid and said means for laminating a backing material, both mounted on said carriage and being activated upon return movement of said carriage in said opposite direction.

2. A device as in claim 1, further including safety clamp means connected to said front end of said flat plate to momentarily clamp said film to insure release of said film from said vertically movable vacuum bar means in the event of photosensitive material contamination.

* * * * *